US009411036B2

(12) United States Patent
Igari et al.

(10) Patent No.: US 9,411,036 B2
(45) Date of Patent: Aug. 9, 2016

(54) LIGHT SOURCE POSITION DETECTION APPARATUS, LIGHT SOURCE TRACKING APPARATUS, CONTROL METHOD AND PROGRAM

(71) Applicants: NATIONAL INSTITUTE OF ADVANCED INDUSTRIAL SCIENCE AND TECHNOLOGY, Tokyo (JP); SOFT WORKS CORPORATION, Hamamatsu-shi, Shizuoka (JP); ISHIKAWA TRADING CO., LTD., Mitaka-shi, Tokyo (JP)

(72) Inventors: Sanekazu Igari, Tsukuba (JP); Katsuhiko Kikuchi, Tokyo (JP); Toshio Shiomi, Hamamatsu (JP); Hideo Ishikawa, Mitaka (JP)

(73) Assignees: NATIONAL INSTITUTE OF ADVANCED INDUSTRIAL SCIENCE AND TECHNOLOGY, Tokyo (JP); ISHIKAWA TRADING CO., LTD, Tokyo (JP)

( * ) Notice: Subject to any disclaimer, the term of this patent is extended or adjusted under 35 U.S.C. 154(b) by 0 days.

(21) Appl. No.: 14/652,077

(22) PCT Filed: Dec. 14, 2012

(86) PCT No.: PCT/JP2012/082550
§ 371 (c)(1),
(2) Date: Jun. 12, 2015

(87) PCT Pub. No.: WO2014/091628
PCT Pub. Date: Jun. 19, 2014

(65) Prior Publication Data
US 2015/0309153 A1    Oct. 29, 2015

(51) Int. Cl.
*G01S 3/786* (2006.01)
*G01C 1/00* (2006.01)
*H04N 5/235* (2006.01)
*H04N 5/238* (2006.01)
*H01L 31/042* (2014.01)
*F24J 2/38* (2014.01)
*F24J 2/54* (2006.01)

(52) U.S. Cl.
CPC ............... *G01S 3/7861* (2013.01); *G01C 1/00* (2013.01); *H01L 31/042* (2013.01); *H04N 5/238* (2013.01); *H04N 5/2353* (2013.01); *F24J 2/38* (2013.01); *F24J 2/542* (2013.01); *Y02E 10/52* (2013.01)

(58) Field of Classification Search
CPC ............... F24J 2/38; F24J 2/542; G01C 1/00; G01S 3/786; G01S 3/7861; H01L 31/042; H04N 5/2353; H04N 5/238; Y02E 10/52
See application file for complete search history.

(56) References Cited

U.S. PATENT DOCUMENTS

2010/0246900 A1    9/2010   Ge et al.

FOREIGN PATENT DOCUMENTS

| JP | 03-051713 A | 3/1991 |
| JP | 05-126563 A | 5/1993 |

(Continued)

OTHER PUBLICATIONS

International Search Report of PCT/JP2012/082550 dated Feb. 19, 2013.

*Primary Examiner* — Mark R Gaworecki
(74) *Attorney, Agent, or Firm* — Arent Fox LLP (57) ABSTRACT

A light source position detection apparatus (10) has a condensing lens (32) that condenses light emitted from the sun, an image pickup device (33) that receives the light condensed by the condensing lens (32), and a CPU (21) that detects the position of the sun based on per-pixel light reception information received by the image pickup device (33), and the CPU (21) changes the shutter speed of the image pickup device (33) and adjusts the quantity of the light received by the image pickup device in response to the quantity of light emitted from the sun. The light source position detection apparatus (10) can detect the position of a light source with high accuracy, and can detect the position of the light source with high accuracy even when the light source is hidden behind clouds, for example.

13 Claims, 7 Drawing Sheets

(56) References Cited

FOREIGN PATENT DOCUMENTS

| JP | 10-197247 A | 7/1998 |
|---|---|---|
| JP | 2000-196125 A | 7/2000 |
| JP | 2000-234925 A | 8/2000 |
| JP | 2000-337876 A | 12/2000 |
| JP | 2004-085270 A | 3/2004 |
| JP | 2004-153203 A | 5/2004 |
| JP | 2004-340784 A | 12/2004 |
| JP | 2009-014495 A | 1/2009 |
| JP | 2009-281980 A | 12/2009 |
| JP | 2010-223915 A | 10/2010 |

FIG.9

LIGHT SOURCE POSITION DETECTION APPARATUS, LIGHT SOURCE TRACKING APPARATUS, CONTROL METHOD AND PROGRAM

CROSS-REFERENCE TO RELATED APPLICATION

This application is a National Stage entry of International Application No. PCT/JP2012/082550, filed Dec. 14, 2012. The disclosure of the priority application is incorporated in its entirety herein by reference.

TECHNICAL FIELD

The present invention relates to a light source position detection apparatus, a light source tracking apparatus, a control method and a program.

BACKGROUND ART

Conventionally, sun tracking sensors are known which use a light position sensor made up of a quadrant photodiode or single element or the like. A sun tracking sensor disclosed in Patent Literature 1 forms an image of sunlight on a quadrant photodiode and a processing circuit outputs X and Y coordinate position signals. Using the X and Y coordinate position signals outputted from the sun tracking sensor enables automatic sun tracking.

CITATION LIST

Patent Literature

Patent Literature 1: Japanese Laid-Open Patent Publication No. 05-126563

SUMMARY OF INVENTION

Technical Problem

However, conventional sun tracking sensors using a light position sensor made up of a quadrant photodiode or single element or the like have a problem that an error of ±0.01° or above occurs with respect to an optical axis of light actually emitted from the sun. For example, a tracking type photovoltaic power system is known which drives a solar panel using information outputted from a sun tracking sensor, for example, so that the solar panel is always oriented toward a direction orthogonal to the sunlight. For such a tracking type photovoltaic power system, a condensing type solar panel is used in recent years in order to improve power generation efficiency. In the case of a condensing type solar panel, since light is condensed using a Fresnel lens, errors of ±0.1° due to the sun tracking sensor are added up, preventing light emitted from the sun from being accurately radiated onto solar cells and causing conversion efficiency to deteriorate. Furthermore, light condensed by the Fresnel lens may be condensed at a position different from the solar battery cell, causing damage to the device due to an abnormal temperature rise. In this way, there is a demand for further improvement of accuracy with which the position of the sun is detected in recent years.

Furthermore, when the sun is hidden behind clouds, the quantity of light emitted from the sun decreases depending on how the sun is hidden, and the conventional sun tracking sensor has a problem that it cannot detect the position of the sun. Moreover, although it is possible to detect the position of the sun to a certain extent depending on how the sun is hidden, light emitted from the sun is scattered by clouds and the light quantity is also detected from parts other than the sun. Therefore, when the sun is hidden behind clouds, there is a problem that it is not possible to accurately detect the position of the sun due to influences of the quantity of light scattered by clouds.

The present invention has been implemented in view of the above-described problems and it is an object of the present invention to accurately detect the position of a light source. It is another object of the present invention to accurately detect the position of a light source even when the light source is hidden behind clouds, for example.

Solution to Problem

A light source position detection apparatus according to the present invention includes a condensing section that condenses light emitted from a light source to be detected, an image pickup device that receives the light condensed by the condensing section, and a control section that detects a position of the light source to be detected based on per-pixel light reception information received by the image pickup device, in which the control section changes a shutter speed of the image pickup device according to a quantity of the light emitted from the light source to be detected and adjusts the quantity of the light received by the image pickup device.

A light source tracking apparatus according to the present invention includes a light source sensor provided with a condensing section that condenses light emitted from a light source to be detected and an image pickup device that receives the light condensed by the condensing section, a control section that detects a position of the light source to be detected based on per-pixel light reception information received by the image pickup device and outputs a drive signal based on the detected position of the light source to be detected, and a drive section that moves the light source sensor based on the drive signal and tracks the light source to be detected, in which the control section changes a shutter speed of the image pickup device according to a quantity of the light emitted from the light source to be detected and adjusts the quantity of the light received by the image pickup device.

A method for controlling a light source tracking apparatus according to the present invention is a method for controlling a light source tracking apparatus including a condensing section that condenses light emitted from a light source to be detected, an image pickup device that receives the light condensed by the condensing section, and a control section that detects a position of the light source to be detected based on per-pixel light reception information received by the image pickup device, in which the control section changes a shutter speed of the image pickup device according to a quantity of the light emitted from the light source to be detected and adjusts the quantity of the light received by the image pickup device.

A program according to the present invention is a program for controlling a light source position detection apparatus including a condensing section that condenses light emitted from a light source to be detected, an image pickup device that receives the light condensed by the condensing section, and a control section that detects a position of the light source to be detected based on per-pixel light reception information received by the image pickup device, in which the program causes the control section to execute a process of changing a shutter speed of the image pickup device according to a quantity of the light emitted from the light source to be detected and adjusting the quantity of the light received by the image pickup device.

Advantageous Effects of Invention

According to the present invention, it is possible to accurately detect the position of a light source. It is also possible to accurately detect the position of the light source even when the light source is hidden, for example, behind clouds.

DESCRIPTION OF EMBODIMENTS

Hereinafter, a light source tracking apparatus 10 according to the present embodiment will be described with reference to the accompanying drawings. The embodiments which will be described below will describe a case where a light source to be detected (hereinafter, referred to as "light source") is assumed to be the sun and the light source tracking apparatus 10 tracks the sun.

(First Embodiment)

Figure 1:
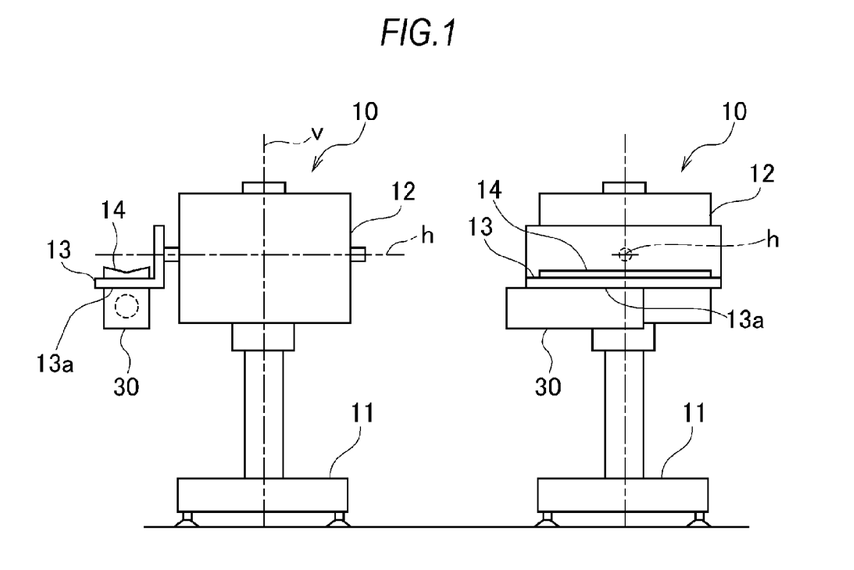
FIG. 1 is a diagram illustrating an external configuration of a light source tracking apparatus of the present embodiment.

FIG. 1 is a diagram illustrating an example of an external configuration of the light source tracking apparatus 10.

As shown in FIG. 1, the light source tracking apparatus 10 includes a base 11, a first driving stand 12, a second driving stand 13, a light source sensor 30 or the like.

The base 11 is, for example, grounded to the earth and rotatably supports the first driving stand 12 around a vertical axis (v-axis).

The first driving stand 12 rotates around the vertical axis (v-axis) by an azimuth tracking motor 26 which will be described later. Furthermore, the first driving stand 12 rotatably supports the second driving stand 13 around a horizontal axis (h-axis).

The second driving stand 13 rotates around the horizontal axis (h-axis) by an elevation angle tracking motor 28 which will be described later. The light source sensor 30 is attached to the second driving stand 13 via a reference surface 13a of the second driving stand 13. A mounting section 14 for mounting a pyrheliometer or sun photometer is set up in the second driving stand 13 for when the light source tracking apparatus 10 is used as a meteorological sensor, for example.

The first driving stand 12 and the second driving stand 13 rotate respectively, and the light source tracking apparatus 10 can thereby orient the light source sensor 30 in a given direction.

Figure 2:
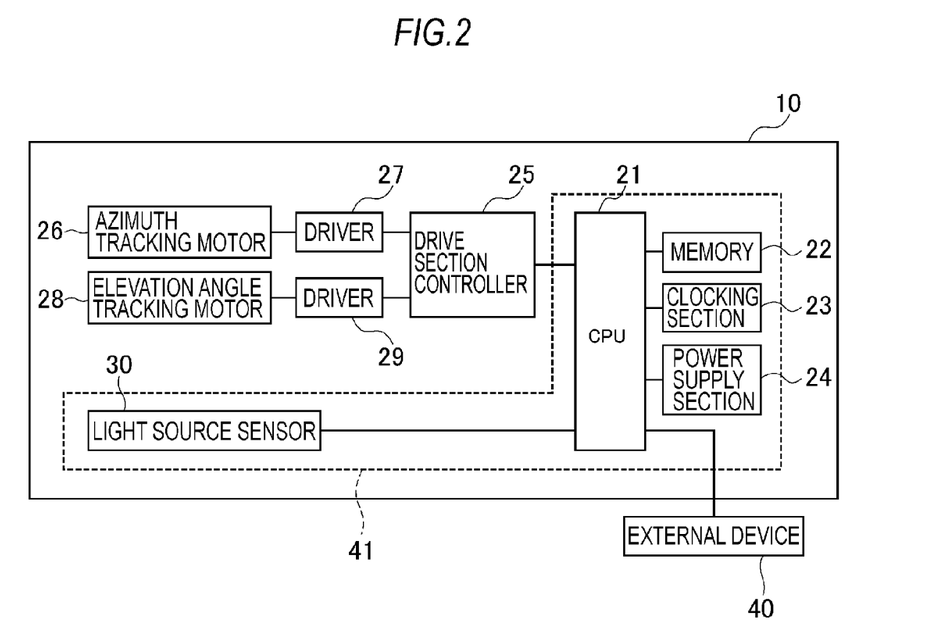
FIG. 2 is a diagram illustrating an internal configuration of the light source tracking apparatus of the present embodiment.

FIG. 2 is a diagram illustrating an example of an internal configuration of the light source tracking apparatus 10.

As shown in FIG. 2, the light source tracking apparatus 10 includes a CPU 21, a memory 22, a clocking section 23, a power supply section 24, a drive section controller 25, the azimuth tracking motor 26, a driver 27, the elevation angle tracking motor 28, a driver 29 and a light source sensor 30 or the like. The light source tracking apparatus 10 performs a process of detecting a position of a light source and a process of tracking the light source. Furthermore, the CPU 21, the memory 22, the clocking section 23, the power supply section 24 and the light source sensor 30 of the light source tracking apparatus 10 function as a light source position detection apparatus 41 that detects the position of a light source.

The CPU 21 is an example of a control section and controls the whole light source tracking apparatus 10. The CPU 21 executes a program stored in the memory 22 and performs a process of detecting the position of the light source or a process for causing the drive section controller 25 to track the light source based on the detected position of the light source.

The memory 22 includes a non-volatile memory such as ROM or EEPROM and a volatile memory such as RAM. The non-volatile memory stores programs to be executed by the CPU 21, thresholds and a table or the like used when the CPU 21 performs processing. The volatile memory is used as a work memory of the CPU 21.

The clocking section 23 clocks the current date and the current time. The CPU 21 acquires time information as the current date and time from the clocking section 23, and can thereby determine a rough estimate of light quantity emitted from the sun on a sunny day (when the sun is not hidden behind clouds).

The power supply section 24 supplies power to drive each component of the light source tracking apparatus 10. The power supply section 24 may be an AC power supply that receives power from a power supply plug or rechargeable battery or the like.

The drive section controller 25 moves the light source sensor 30 based on an instruction from the CPU 21. More specifically, the drive section controller 25 controls an orientation of the light source sensor 30 by driving the azimuth tracking motor 26 and the elevation angle tracking motor 28 via the driver 27 and the driver 29.

The azimuth tracking motor 26 is an example of a drive section and rotates the first driving stand 12 around the vertical axis as shown in FIG. 1. Along with the rotation of the first driving stand 12, the light source sensor 30 mounted on the second driving stand 13 via the first driving stand 12 also rotates around the vertical axis.

The elevation angle tracking motor 28 is an example of the drive section and causes the second driving stand 13 to rotate around the horizontal axis as shown in FIG. 1. Along with the rotation of the second driving stand 13, the light source sensor 30 mounted on the second driving stand 13 also rotates around the horizontal axis.

The light source sensor 30 receives light emitted from the sun and transmits the received light information to the CPU 21. The light source sensor 30 adjusts the quantity of light received from the sun based on an instruction from the CPU 21. The configuration of the light source sensor 30 will be described later with reference to FIG. 3.

Furthermore, an external device 40 such as a personal computer (PC) can be connected to the light source tracking apparatus 10. For example, the user can directly instruct the light source tracking apparatus 10 via an external device 40 or rewrite a program, thresholds and a table or the like stored in the memory 22. When the light source tracking apparatus 10 is used to perform tracking so that, for example, the light receiving surface of the solar panel is oriented toward a direction orthogonal to the sun, the external device 40 can be connected to a drive apparatus that drives the orientation of the light receiving surface of the solar panel.

Additionally, the light source tracking apparatus 10 may also include an input section that directly receives an instruction from the user.

Figure 3:
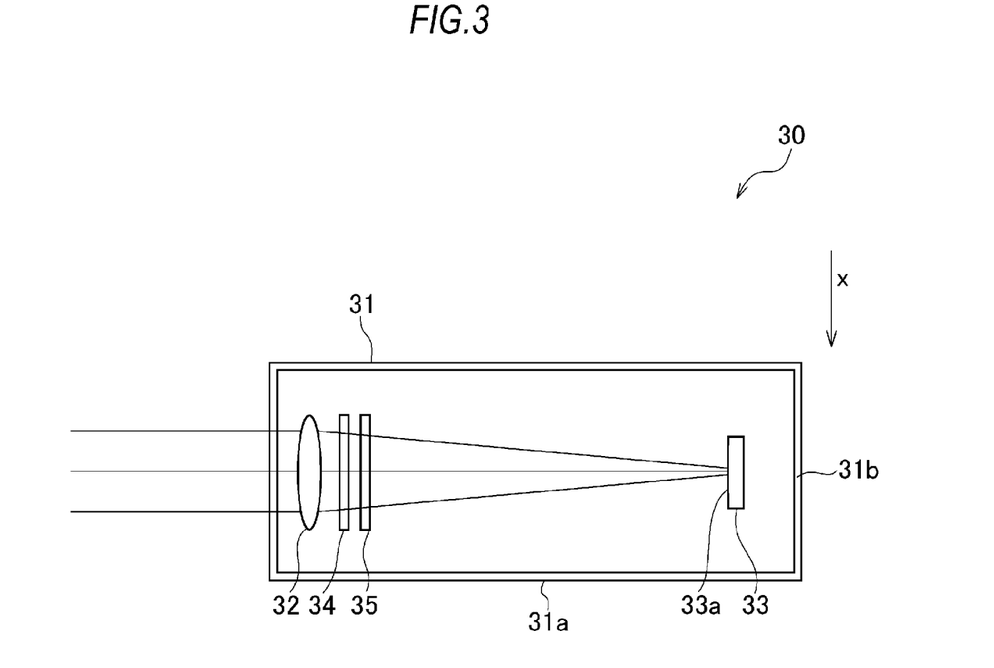
FIG. 3 is a diagram illustrating a configuration of a light source sensor according to a first embodiment.

Next, the light source sensor 30 will be described with reference to FIG. 3.

The light source sensor 30 includes a case 31, a condensing lens 32, an image pickup device 33, a neutral density filter 34, a visible light interrupting/infrared light pass filter 35 or the like.

The case 31 is formed, for example, into a hollow shape and supports the condensing lens 32, the image pickup device 33, the neutral density filter 34 and the visible light interrupting/infrared light pass filter 35 to their respective predetermined positions. Reference surfaces 31a and 31b are formed on outer surfaces of the case 31. The reference surface 31a is a surface along a direction orthogonal to a light receiving surface 33a of the image pickup device 33. The reference surface 31b is a surface parallel to the light receiving surface 33a of the image pickup device 33. By mounting the light source sensor 30 on the second driving stand 13 via the reference surface 31a and the reference surface 31b of the case 31, it is possible to accurately mount the light source sensor 30 on the second driving stand 13. Moreover, by forming the reference surface 31a and the reference surface 31b, it is possible to accurately mount the light source sensor 30 on other light source tracking apparatuses.

The condensing lens 32 functions as a condensing section that condenses light emitted from the sun on the light receiving surface 33a of the image pickup device 33.

As the image pickup device 33, a CCD (charge coupled device), CMOS (complementary metal-oxide semiconductor) or the like can be used. The image pickup device 33 with the suitable size and number of pixels can be used depending on a light source.

The image pickup device 33 receives light condensed by the condensing lens 32 for each pixel, converts the received light to charge and stores the charge, and converts the stored charge to electric signals. The image pickup device 33 transmits the converted electric signals to the CPU 21 as light reception information. The light reception information includes brightness information (or gradation information) of 0 to 255, for example, that increases/decreases according to the quantity of light received for each pixel. Here, brightness "0" corresponds to a case where no light is received and no charges is stored, and brightness "255" corresponds to a case where light is received and charge is stored up to a saturation level. Since the CPU 21 can acquire per-pixel brightness information, the CPU 21 can detect at which position of the light receiving surface 33a of the image pickup device 33 light is condensed.

Furthermore, the image pickup device 33 includes a mechanism of a so-called electronic shutter. More specifically, the image pickup device 33 can adjust the quantity of received light by changing, namely, extending or shortening a charge storage time. This process of changing the charge storage time corresponds to a process of changing the shutter speed. The shutter speed is changed based on an instruction of the CPU 21.

For example, when the brightness information received by the CPU 21 includes a pixel of brightness "255", since a saturation level of charge is reached, it is difficult to detect an accurate position of the light source. In this case, the CPU 21 can acquire light reception information suitable for detecting the position of the light source by increasing the shutter speed of the image pickup device 33 (shortening the charge storage time).

On the other hand, when the brightness information received by the CPU 21 includes more small brightness, noise may be mixed therein, and so it is difficult to detect an accurate position of the light source. In this case, the CPU 21 reduces the shutter speed of the image pickup device 33 (extends the charge storage time), and can thereby acquire light reception information suitable for detecting the position of the light source.

The neutral density filter 34 is a filter that reduces the quantity of light condensed by the condensing lens 32 and emitted to the image pickup device 33. In the present embodiment, the neutral density filter 34 is preferably a filter that reduces light so that the charge stored in the image pickup device 33 does not reach the saturation level when the quantity of light emitted from the sun is a maximum (for example, on a sunny day in the summer). Note that the filter that reduces light is not limited to the neutral density filter 34 but may also be a heat ray cutting filter.

The visible light interrupting/infrared light pass filter 35 is a filter that interrupts visible light out of the light emitted from the sun and allows infrared light to pass therethrough. The visible light interrupting/infrared light pass filter 35 is an example of infrared light image forming means for forming images of infrared light on the light receiving surface 33a of the image pickup device 33 without forming images of visible light on the light receiving surface 33a of the image pickup device 33. On sunny days, since light emitted from the sun directly reaches, it is possible to detect the position of the sun by receiving visible light. On the other hand, when the sun is hidden behind clouds, light emitted from the sun is scattered by clouds. Even when the scattered visible light is received, it is difficult to accurately detect the position of the sun. Thus, the present embodiment takes advantage of the nature of infrared light that the infrared light has a longer wavelength than visible light, and is hardly scattered by clouds and passes through clouds. More specifically, visible light interrupting/infrared light pass filter 35 interrupts visible light scattered by clouds and causes the infrared light passing through clouds to be emitted to the light receiving surface 33a of the image pickup device 33. Since the image pickup device 33 also has spectral sensitivity of infrared light which is closer to the long wavelength side than visible light, even when the sun is hidden behind clouds, the CPU 21 can acquire light reception information suitable for detecting the position of the sun from infrared light.

Figure 4:
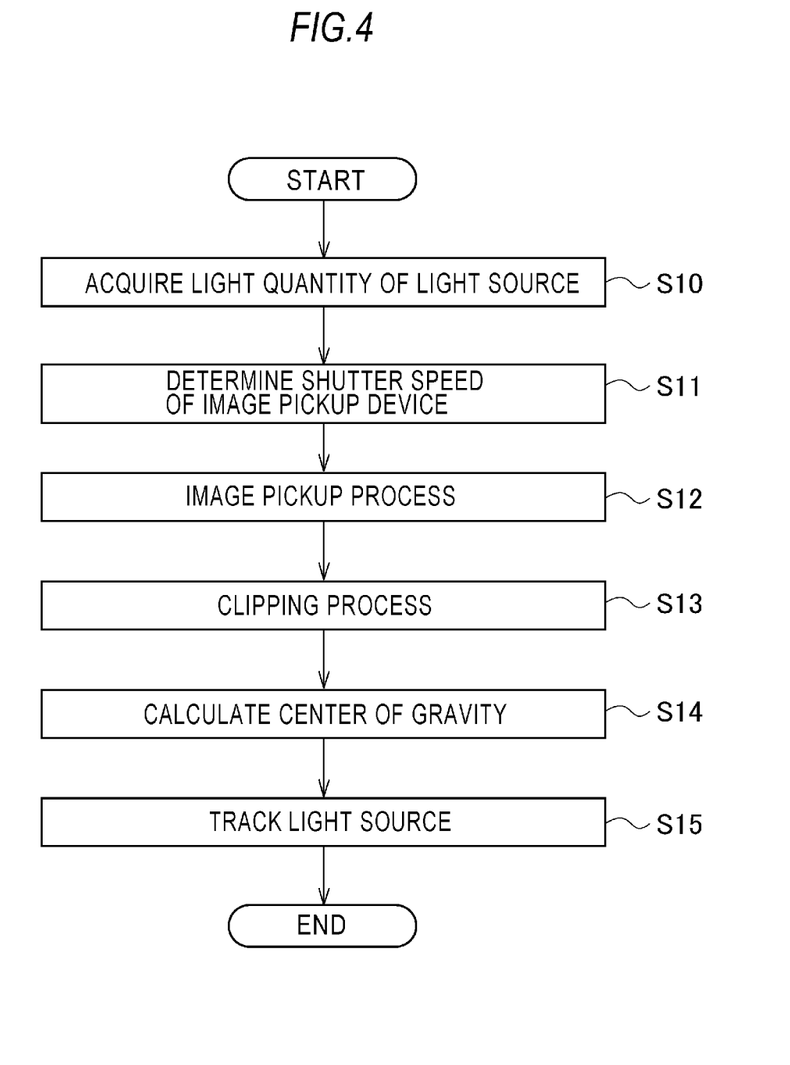
FIG. 4 is a flowchart showing processing of the light source tracking apparatus of the present embodiment.

Next, a process by the light source tracking apparatus 10 of tracking the sun will be described with reference to a flowchart in FIG. 4. Here, a case will be described where the position of the center of gravity of solar energy is detected. The flowchart in FIG. 4 is implemented by the CPU 21 executing a program stored in the memory 22. Note that light emitted from the sun is condensed at any one position of the light receiving surface 33a of the image pickup device 33 of the light source sensor 30.

In step S10, the CPU 21 acquires the light quantity of a light source via the image pickup device 33. More specifically, the CPU 21 instructs the image pickup device 33 to pick up images at a predetermined shutter speed stored in the memory 22 in advance. The image pickup device 33 receives the light of the sun emitted via the condensing lens 32, the neutral density filter 34 and the visible light interrupting/infrared light pass filter 35 at the instructed shutter speed and transmits light reception information to the CPU 21.

In step S11, the CPU 21 changes the shutter speed of the image pickup device 33 according to the quantity of light emitted from the sun and adjusts the quantity of the light received by the image pickup device 33. More specifically, the CPU 21 determines the shutter speed based on the brightness information of the light reception information received from the image pickup device 33 in step S10. The memory 22 stores a table that associates, for example, a maximum value of brightness with an optimum shutter speed corresponding to the maximum value of brightness. In this table, for example, when the maximum value of brightness is close to "255" (when brightness is large), a higher shutter speed is associated and when the maximum value of brightness is close to "0" (when brightness is small), a lower shutter speed is associated. The CPU 21 acquires the maximum value of brightness and looks up the table stored in the memory 22 and thereby determines the shutter speed associated with the maximum value of brightness. Therefore, when the quantity of light emitted from the sun is large, the maximum value of brightness increases, and therefore the CPU 21 determines a higher shutter speed. On the other hand, when the sun is hidden behind clouds and the quantity of light emitted from the sun is small, the maximum value of brightness is small, and so the CPU 21 determines a lower shutter speed. Here, although the quantity of light emitted from the sun is determined using the maximum value of brightness, for example, an average brightness value may also be used. In this case, the CPU 21 determines a higher shutter speed when the average brightness value of a pixel is large and determines a lower shutter speed when the average brightness value of a pixel is small. For example, as the shutter speed, the CPU 21 preferably determines a shutter speed so that brightness smaller than 255 is outputted when the maximum value of brightness is brightness greater than a predetermined threshold A used in step S13 which will be described later.

In step S12, the CPU 21 instructs the image pickup device 33 to pick up images at the shutter speed determined in step S11. The image pickup device 33 receives the light of the sun emitted via the condensing lens 32, the neutral density filter 34 and the visible light interrupting/infrared light pass filter 35 at the instructed shutter speed and transmits light reception information including brightness information to the CPU 21.

Figure 5:
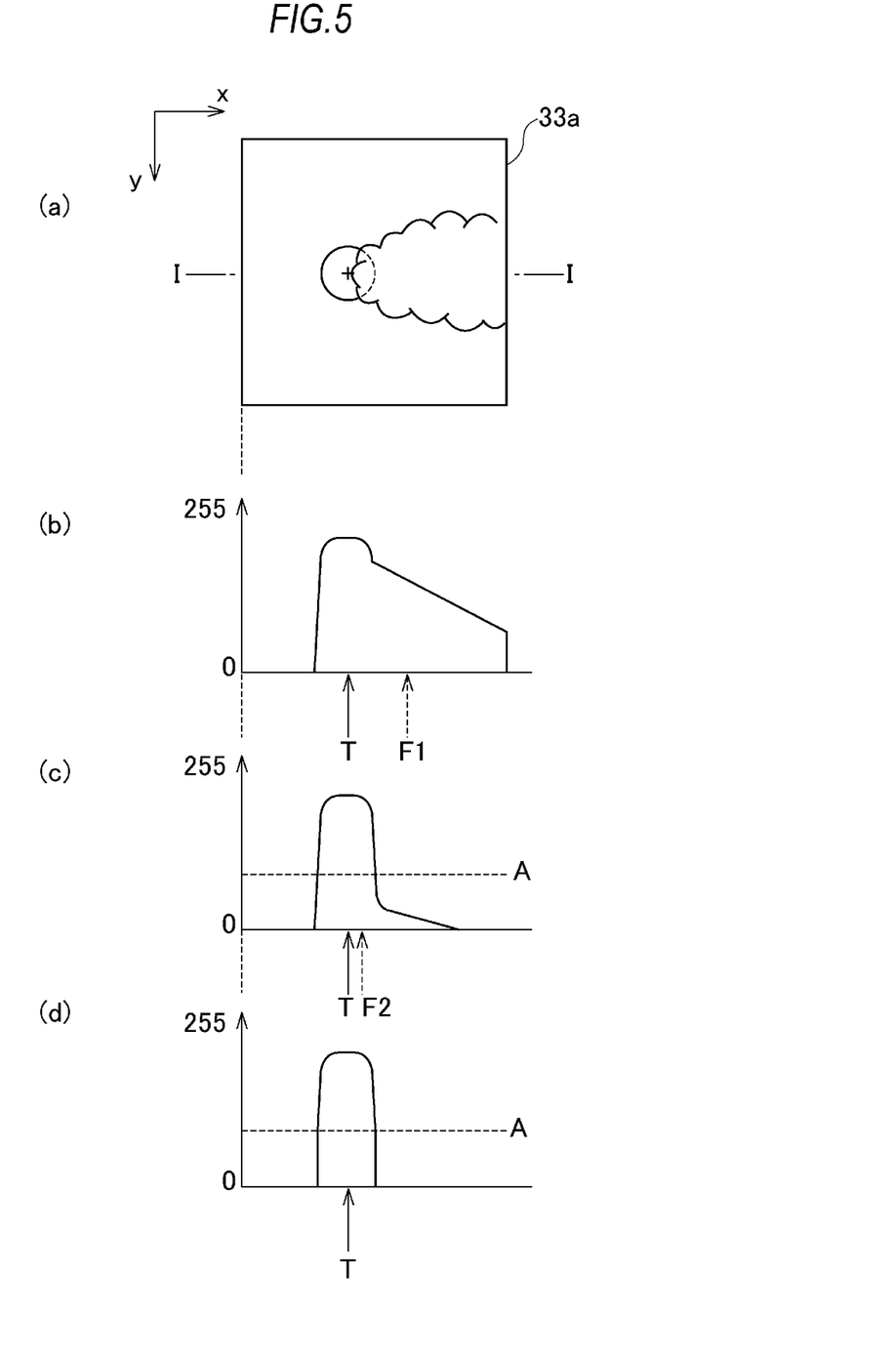
FIG. 5 is a diagram for describing clipping processing of the present embodiment.

In step S13, the CPU 21 performs a clipping process of clipping part of the brightness information received from the image pickup device 33. Here, the clipping process will be described with reference to FIG. 5. FIG. 5(a) is a diagram illustrating an image of an object in which part of the sun is hidden behind a cloud, with an image of the sun being formed on the light receiving surface 33a of the image pickup device 33. Here, suppose the horizontal direction corresponds to the x-axis and the vertical direction corresponds to the y-axis.

FIG. 5(b) and FIG. 5(c) illustrate, in graph, brightness information of pixels along a line I-I in FIG. 5(a). Note that in FIG. 5(b) and FIG. 5(c), since the shutter speed is adjusted to an optimum one by aforementioned step S11, brightness information suitable for detecting the position of the light source is acquired.

FIG. 5(b) illustrates brightness information when an image of light also including visible light is formed without using the visible light interrupting/infrared light pass filter 35. As shown in FIG. 5(b), since visible light out of the light emitted from the sun is scattered by clouds, high brightness appears even in the part of the cloud. Therefore, although the actual center of gravity of solar energy is a position shown by an arrow T, the center of gravity is detected as a position shown by an arrow F1 due to scattering of visible light.

On the other hand, FIG. 5(c) illustrates brightness information when visible light is interrupted using the visible light interrupting/infrared light pass filter 35, infrared light is allowed to pass and an image thereof is formed. As shown in FIG. 5(c), by interrupting visible light, light scattered by clouds is interrupted and infrared light passes through the clouds, and so high brightness appears only in the part of the sun. Therefore, the position shown by an arrow F2 which is a position close to the arrow T of the actual center of gravity of solar energy is detected as the center of gravity.

In this way, by using the visible light interrupting/infrared light pass filter 35, it is possible to prevent scattering of visible light by clouds even when the sun is hidden behind clouds.

The CPU 21 performs a clipping process of clipping brightness information equal to or lower than a predetermined threshold out of the acquired brightness information. To be more specific, the process carried out by the CPU 21 will be described. Here, suppose the horizontal direction of the light receiving surface 33a is the x-axis and the vertical direction is the y-axis, and brightness of a pixel at coordinates (x, y) is f(x, y). When f(x, y) is equal to or lower than the predetermined threshold A, the CPU 21 performs a process (clipping process) of assuming f(x, y)=0 on all pixels. Note that the threshold A is preferably a value whereby brightness resulting from light scattered by clouds can be rounded down. FIG. 5(d) illustrates, in graph, brightness information obtained by assuming brightness equal to or less than the predetermined threshold A to be 0. As shown in FIG. 5(d), performing the clipping process allows the detected position of the center of gravity to match the actual center of gravity of the solar energy shown by the arrow T.

In step S14, the CPU 21 calculates the center of gravity of solar energy. More specifically, the CPU 21 calculates coordinates of the center of gravity (Xg, Yg) using f(x, y) after the clipping process according to the following Equation 1. This process allows the CPU 21 to accurately detect the position of the sun.

$$(Xg, Yg) = \left( \frac{\sum (f(x, y) \times x)}{\sum f(x, y)}, \frac{\sum (f(x, y) \times y)}{\sum f(x, y)} \right) \quad \text{[Equation 1]}$$

In step S15, the CPU 21 performs a process for causing the drive section controller 25 to track a light source based on the detected position of the sun. More specifically, the CPU 21 calculates distances in the x direction and y direction between the center coordinates of the light receiving surface 33a of the image pickup device 33 and the coordinates of the center of gravity of solar energy. Next, the CPU 21 calculates an angle of inclination of the optical axis of the sun with respect to the light source sensor 30 based on the calculated distances. The CPU 21 may also calculate the angle of inclination by looking up a table stored in the memory 22 that associates the distances in the x direction and the y direction with angles of inclination or may geometrically calculate the angle of inclination based on the distances in the x direction and the y direction.

Figure 6:
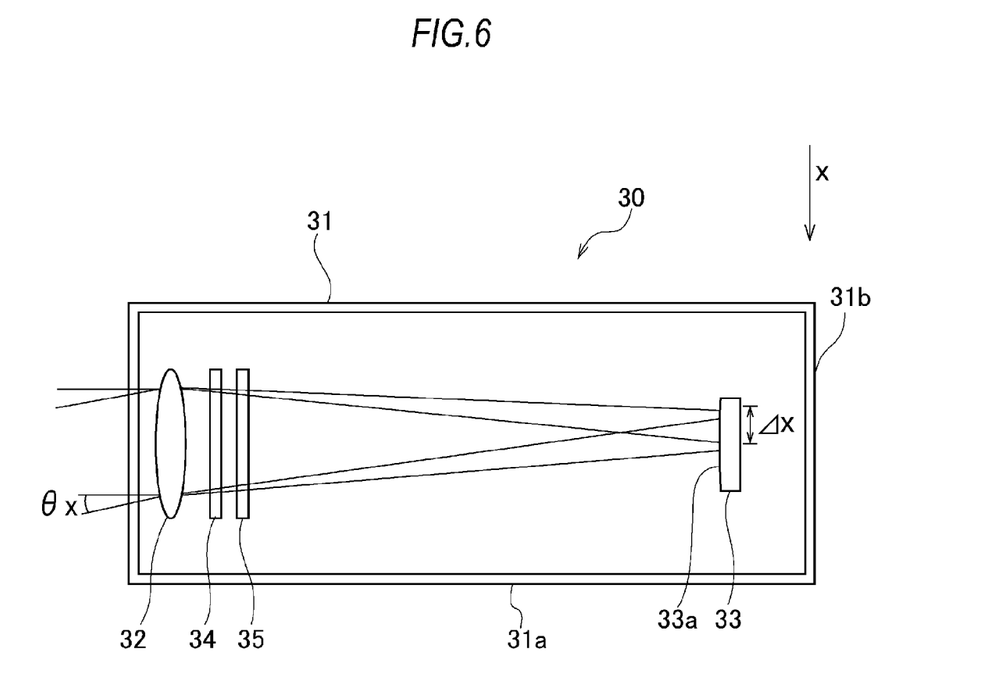
FIG. 6 is a diagram for describing processing of tracking the sun of the present embodiment.

FIG. 6 is a diagram illustrating a situation in which there is a distance of Δx between the coordinates of the center of gravity of energy of light emitted from the sun and the center coordinates. In this case, from Δx, the CPU 21 calculates θx as the angle of inclination of the optical axis of the sun.

The CPU 21 transmits information on the angle of inclination calculated to track the sun to the drive section controller 25. The drive section controller 25 transmits drive signals to the azimuth tracking motor 26 and the elevation angle tracking motor 28 based on the information on the angle of inclination transmitted from the CPU 21. As the azimuth tracking motor 26 and the elevation angle tracking motor 28 operate in response to the respective drive signals, the first driving stand 12 and the second driving stand 13 move. The movement of the first driving stand 12 and the second driving stand 13 allows the optical axis of the sun to accurately match the center coordinates of the light source sensor 30, and the sun tracking process thereby ends.

The light source tracking apparatus 10 continues the processes from step S10 to step S15 all the time, and can thereby track the sun with high accuracy.

Figure 7:
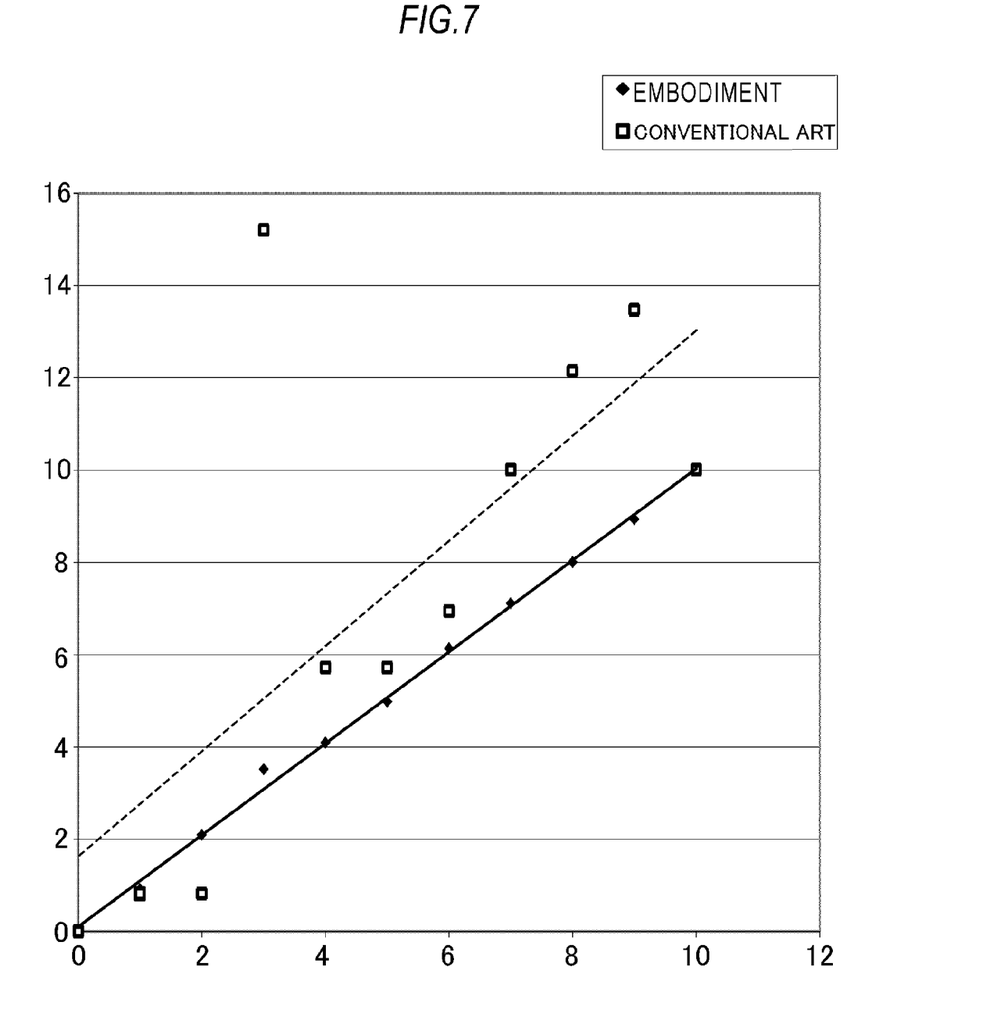
FIG. 7 is a diagram showing a comparison between the light source sensor of the present embodiment and a conventional light source sensor.

FIG. 7 shows a graph obtained by plotting positions when a conventional light source tracking apparatus using an optical position sensor and the light source tracking apparatus 10 according to the present embodiment respectively detect an identical light source. In FIG. 7, the horizontal axis denotes a position when the light source is moved at a predetermined interval and the vertical axis denotes a position of the light source detected by each light source tracking apparatus. A broken line in the graph corresponds to a regression straight line of plots outputted from the conventional light source tracking apparatus and a solid line in the graph corresponds to a regression straight line of plots outputted from the light source tracking apparatus 10 of the present embodiment.

As shown in FIG. 7, the plots outputted by the conventional light source tracking apparatus are not located on the regression straight line, and a determining coefficient $R^2$ that indicates a correlation is $R^2=0.5087$ showing a low correlation. On the other hand, the plots outputted by the light source tracking apparatus 10 of the present embodiment are located substantially on the regression straight line, and a determining coefficient $R^2$ that indicates a correlation is $R^2=0.9975$ showing quite a high correlation. It has been successfully proven that the light source tracking apparatus 10 of the present embodiment can reduce an error of the angle of inclination with respect to the optical axis of the light source to ±0.001° or less, and can detect the position of the light source with high accuracy.

Therefore, for example, when a pyrheliometer is attached to the mounting section 14 of the light source tracking apparatus 10, the pyrheliometer tracks the sun with high accuracy, and can thereby accurately measure an amount of solar radiation. Furthermore, for example, when the CPU 21 sends the calculated angle of inclination to the drive apparatus of the solar panel, the solar panel can always track the sun with high accuracy in a direction orthogonal to the sun, and can thereby improve conversion efficiency. In the case of a condensing type solar panel in particular, light is condensed by a Fresnel lens and errors are thereby added up, and such errors of the conventional light source tracking apparatus will prevent accurate radiation of light onto a solar battery cell. Using the light source tracking apparatus 10 of the present embodiment makes it possible to minimize errors and so the light source tracking apparatus 10 is also applicable to a condensing type solar panel.

Note that although a case has been described in step S10 of the aforementioned embodiment where the CPU 21 instructs the image pickup device 33 to pick up images at a predetermined shutter speed stored beforehand in the memory 22, the present invention is not limited to this case. For example, the memory 22 may store, beforehand, a table that associates time information of the current date and time with a shutter speed. This table associates, for example, the winter season or morning and evening times with slow shutter speeds and associates the summer season or daytime with quick shutter speeds. In this case, the CPU 21 acquires time information on the current date and time from the clocking section 23 and acquires a shutter speed associated with the time information by looking up the table stored in the memory 22. Next, the CPU 21 indicates the acquired shutter speed to the image pickup device 33, and can thereby acquire light reception information suitable for when determining the shutter speed in step S11.

Furthermore, the processes in step S10 and step S11 may be repeated until light reception information suitable for detecting the position of the sun can be acquired. That is, after determining the shutter speed in step S11, the process returns to step S10 and instructs the image pickup device 33 to pick up images at a determined shutter speed. After that, when light reception information suitable for detecting the position of the sun can be acquired, the CPU 21 can proceed to step S12.

A case has been described in the aforementioned embodiment where the visible light interrupting/infrared light pass filter 35 is used as the infrared light image forming means, but the present invention is not limited to this case. For example, the condensing lens 32 itself may be a lens that forms images of infrared light that passes through clouds on the image pickup device 33 without forming images of visible light on the image pickup device 33.

(Second Embodiment)

A case has been described in the first embodiment where the condensing lens 32 is used as a condensing section that condenses light emitted from the sun on the light receiving surface 33a of the image pickup device 33. The present embodiment will describe a case where a pinhole is used as the condensing section.

Figure 8:
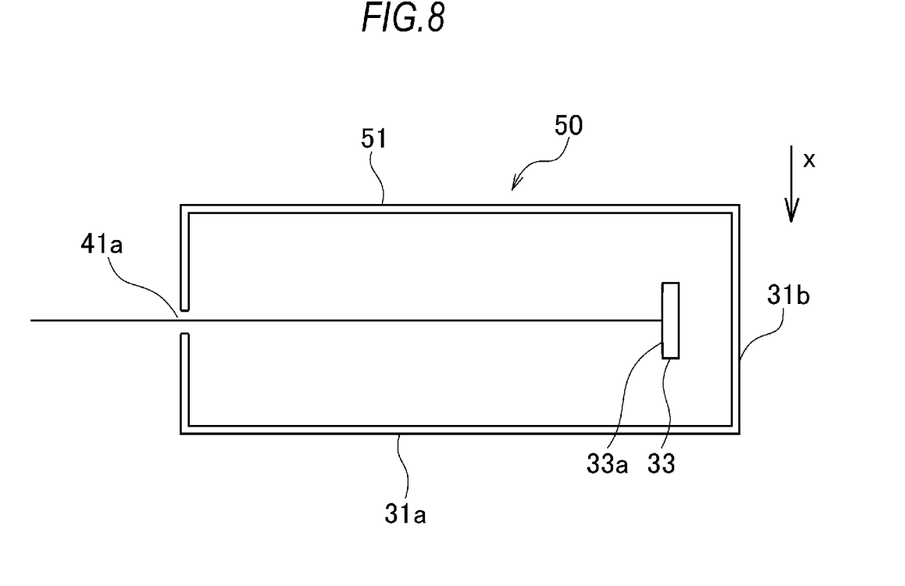
FIG. 8 is a diagram illustrating a configuration of a light source sensor according to a second embodiment.

FIG. 8 is a diagram illustrating a configuration of a light source sensor 50 according to a second embodiment. Note that components identical to those in the light source sensor 30 of the first embodiment are assigned identical reference numerals and description thereof will be omitted as appropriate.

The light source sensor 50 includes a case 51, an image pickup device 33 or the like.

The case 51 is formed, for example, into a hollow shape, and a pinhole 51a is formed as a condensing section that condenses light emitted from the sun on the light receiving surface 33a of the image pickup device 33. The pinhole 51a also has a function of reducing the quantity of light radiated onto the image pickup device 33. Moreover, reference surfaces 31a and 31b similar to those in the first embodiment are formed on outer surfaces of the case 51.

According to the present embodiment, it is possible to condense the light condensed by the pinhole 51a on the light receiving surface 33a of the image pickup device 33, and thereby detect the position of the sun with high accuracy as in the case of the first embodiment. It is also possible to simplify the configuration of the light source sensor 50 compared to the first embodiment, and thereby reduce the manufacturing cost.

(Third Embodiment)

A case has been described in the first embodiment and the second embodiment where the condensing lens 32 or the pinhole 51a is used as the condensing section. The present embodiment will describe a case where a wide-angle lens is used as the condensing section.

Figure 9:
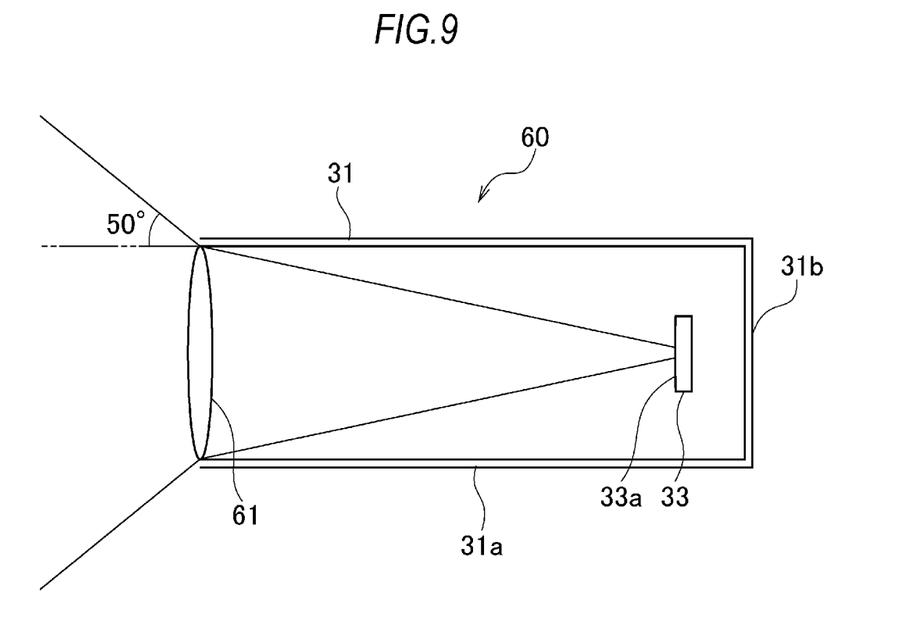
FIG. 9 is a diagram illustrating a configuration of a light source sensor according to a third embodiment.

FIG. 9 is a diagram illustrating a configuration of a light source sensor 60 according to a third embodiment. Note that components identical to those in the light source sensor 30 of the first embodiment are assigned identical reference numerals and description thereof will be omitted as appropriate.

The light source sensor 60 includes the case 31, a wide-angle lens 61 and the image pickup device 33 or the like.

The wide-angle lens 61b can condense even light emitted at a large angle of inclination (e.g., 50°) of the optical axis of the sun on the light receiving surface 33a of the image pickup device 33. Using the wide-angle lens 61 in this way allows the light source sensor 60 of the present embodiment to detect the position of the sun over a wide range.

Therefore, the light source sensor 60 of the present embodiment is suitable for use to detect a light source that moves faster than the sun (e.g., missile) or when setting up the light source tracking apparatus 10 on a water surface (e.g., ship). The light source sensor 60 of the present embodiment may be configured of a plurality of components in combination with the light source sensor 30 of the first embodiment or the light source sensor 50 of the second embodiment. For example, the light source sensor 30 (first light source sensor) and the light source sensor 60 (second light source sensor) may be placed in parallel and mounted on the second driving stand 13. In this case, the CPU 21 can detect and track a rough position of the sun based on the light reception information acquired from the light source sensor 60 (after aforementioned step S10 to step S15) first, and then detect and track an accurate position of the sun based on the light reception information acquired from the light source sensor 30 (aforementioned step S10 to step S15). By configuring the light source tracking apparatus 10 in this way, it is possible to track the light source early and accurately even when detecting a light source that moves faster than the sun or when setting up the light source tracking apparatus 10 on a water surface (e.g., ship). Note that a fish-eye lens or the like may be used as the wide-angle lens 61.

(Fourth Embodiment)

A case has been described in the first embodiment where the CPU 21 calculates the center of gravity of solar energy, but the present invention is not limited to this case. The CPU 21 may also calculate the center of gravity of graphics (geometric center of gravity) when the shape (contours) of the sun is seen as graphics. When calculating the geometric center of gravity, a binarization process may be executed instead of the clipping process in step S13 in the flowchart in FIG. 4.

That is, in step S13, the CPU 21 executes the binarization process based on the brightness information received from the image pickup device 33. More specifically, the CPU 21 uses a predetermined threshold A as a boundary, and performs the process on all pixels by assuming $f(x, y)=0$ when $f(x, y)$ is equal to or below a predetermined threshold A, and $f(x, y)=1$ when $f(x, y)$ is greater than the predetermined threshold A.

In step S14, the CPU 21 calculates center of gravity coordinates $(X_g, Y_g)$ using $f(x, y)$ after the binarization process according to the aforementioned Equation 1. The CPU 21 can calculate a position of the geometric center of gravity of the sun through this process.

In the light source tracking apparatus 10, the user can set whether to calculate an energy center of gravity or calculate a geometric center of gravity via a PC of the external device 40 or the like. The CPU 21 calculates the energy center of gravity or geometric center of gravity according to the setting. Note that the user may set whether to calculate an energy center of gravity or calculate a geometric center of gravity depending on the purpose of tracking the light source.

Although the present invention has been described together with various embodiments so far, the present invention is not limited to these embodiments alone, but can be changed within the scope of the present invention or the respective embodiments can be combined.

For example, a case has been described in the aforementioned embodiments where the light source is the sun, but the present invention is not limited to this case. The present invention is applicable to any light source as long as it is a light source that emits light.

A case has been described in the aforementioned embodiments where the image pickup device 33 transmits brightness information of 0 to 255 for each pixel, but without being limited to this case, for example, brightness information of 0 to 127, 0 to 511 or the like may be transmitted.

A case has been described in the aforementioned embodiments where the azimuth tracking motor 26 and the elevation angle tracking motor 28 are used as the drive sections, but without being limited to this case, any drive section may be used as long as it can track a light source.

A case has been described in the aforementioned embodiments where the light source tracking apparatus 10 includes the drive section controller 25, but the CPU 21 may include the function of the drive section controller 25 and the drive section controller 25 may be omitted.

The present embodiment can also be implemented by supplying a program for implementing the aforementioned processes to the light source tracking apparatus 10 via a network or various storage media and the CPU 21 of the light source tracking apparatus 10 reading and executing the supplied program. The present invention may be a storage medium that records the program.

INDUSTRIAL APPLICABILITY

The present invention can be used for a light source position detection apparatus or a light source tracking apparatus or the like.

The invention claimed is:

1. A light source position detection apparatus, comprising:
a condensing section that condenses light emitted from a light source to be detected;
an image pickup device that receives the light condensed by the condensing section;
infrared light image forming means for forming an image of infrared light that passes through clouds on the image pickup device, out of light emitted from the light source to be detected without forming any image of visible light on the image pickup device; and
a control section,
wherein the control section performs:
a first acquisition process of acquiring per-pixel brightness information from the image pickup device;
a process of changing a shutter speed based on the brightness information acquired in the first acquisition process and adjusting the quantity of light received by the image pickup device;
a second acquisition process of acquiring per-pixel brightness information from the image pickup device, the shutter speed of which is changed;
a process of rounding down brightness information equal to or less than a threshold set to a value greater than brightness caused by light scattered by clouds out of the brightness information acquired in the second acquisition process; and
a process of detecting the position of the light source to be detected based on brightness information after the rounding down process.

2. The light source position detection apparatus according to claim 1, wherein in the process of adjusting the light quantity, the shutter speed is changed to one in which a maximum value of the brightness information is greater than the threshold.

3. The light source position detection apparatus according to claim 1, wherein the control section
acquires time information, and
acquires, in the first acquisition process, per-pixel brightness information from the image pickup device at a shutter speed associated with the acquired time information.

4. The light source position detection apparatus according to claim 3, wherein the infrared light image forming means is a visible light interrupting/infrared light pass filter that interrupts visible light and allows infrared light to pass therethrough.

5. The light source position detection apparatus according to claim 3, wherein the infrared light image forming means is a condensing lens that condenses infrared light on the image pickup device.

6. The light source position detection apparatus according to claim 1, wherein the process of rounding down the brightness information is a clipping process of assuming brightness information equal to or less than the threshold to be 0.

7. The light source position detection apparatus according to claim 1, wherein the process of rounding down the brightness information is a binarization process using the predetermined threshold.

8. The light source position detection apparatus according to claim 1, wherein the condensing section is any one of a condensing lens, a pinhole and a wide-angle lens.

9. The light source position detection apparatus according to claim 1, further comprising a case that supports the image pickup device, wherein the case comprises a reference surface along a direction orthogonal to a light receiving surface of the image pickup device and a reference surface parallel to the light receiving surface of the image pickup device.

10. A light source tracking apparatus, comprising:
a light source sensor that includes a condensing section that condenses light emitted from a light source to be detected, an image pickup device that receives the light condensed by the condensing section, and infrared light image forming means for forming an image of infrared light that passes through clouds on the image pickup device, out of light emitted from the light source to be detected without forming any image of visible light on the image pickup device;
a control section that detects a position of the light source to be detected based on per-pixel brightness information received by the image pickup device and outputs a drive signal based on the detected position of the light source to be detected; and
a drive section that moves the light source sensor based on the drive signal and tracks the light source to be detected, wherein the control section performs:
a first acquisition process of acquiring per-pixel brightness information from the image pickup device;
a process of changing a shutter speed based on the brightness information acquired in the first acquisition process and adjusting the quantity of light received by the image pickup device;
a second acquisition process of acquiring per-pixel brightness information from the image pickup device, the shutter speed of which is changed;
a process of rounding down brightness information equal to or less than a threshold set to a value greater than brightness caused by light scattered by clouds out of the brightness information acquired in the second acquisition process; and
a process of detecting the position of the light source to be detected based on brightness information after the rounding down process.

11. The light source tracking apparatus according to claim 10, further comprising a first light source sensor and a second light source sensor as the light source sensor,
wherein the condensing section of the first light source sensor is a condensing lens or a pinhole,
the condensing section of the second light source sensor is a wide-angle lens,
the control section detects a position of the light source to be detected based on per-pixel brightness information received by the image pickup device of the second light source sensor, outputs a drive signal to the drive section based on the detected position of the light source to be detected, then detects the position of the light source to be detected based on the per-pixel brightness information received by the image pickup device of the first light source sensor and outputs a drive signal to the drive section based on the detected position of the light source to be detected.

12. A method for detecting a light source position for a light source position detection apparatus, the apparatus comprising:
a condensing section that condenses light emitted from a light source to be detected;
an image pickup device that receives the light condensed by the condensing section; and
infrared light image forming means for forming an image of infrared light that passes through clouds on the image pickup device, out of light emitted from the light source to be detected without forming any image of visible light on the image pickup device,
the method performing:
a first acquisition process of acquiring per-pixel brightness information from the image pickup device;
a process of changing a shutter speed based on the brightness information acquired in the first acquisition process and adjusting the quantity of light received by the image pickup device;
a second acquisition process of acquiring per-pixel brightness information from the image pickup device, the shutter speed of which is changed;
a process of rounding down brightness information equal to or less than a threshold set to a value greater than brightness caused by light scattered by clouds out of the brightness information acquired in the second acquisition process; and
a process of detecting the position of the light source to be detected based on brightness information after the rounding down process.

13. A non-transitory computer-readable medium for controlling a light source position detection apparatus, the apparatus comprising:
a condensing section that condenses light emitted from a light source to be detected;
an image pickup device that receives the light condensed by the condensing section;
infrared light image forming means for forming an image of infrared light that passes through clouds on the image pickup device, out of light emitted from the light source to be detected without forming any image of visible light on the image pickup device; and
a control section, the non-transitory computer-readable medium storing instructions that, when executed by a processor, cause the control section to perform:
a first acquisition process of acquiring per-pixel brightness information from the image pickup device;
a process of changing a shutter speed based on the brightness information acquired in the first acquisition process and adjusting the quantity of light received by the image pickup device;
a second acquisition process of acquiring per-pixel brightness information from the image pickup device, the shutter speed of which is changed;
a process of rounding down brightness information equal to or less than a threshold set to a value greater than brightness caused by light scattered by clouds out of the brightness information acquired in the second acquisition process; and
a process of detecting the position of the light source to be detected based on brightness information after the rounding down process.

* * * * *